(12) United States Patent
Hartmann et al.

(10) Patent No.: US 8,410,368 B2
(45) Date of Patent: Apr. 2, 2013

(54) ELECTRICAL CONDUCTOR

(75) Inventors: Samuel Hartmann, Wohlenschwil (CH); Dominik Truessel, Bremgarten (CH)

(73) Assignee: ABB Research Ltd., Zürich (CH)

( * ) Notice: Subject to any disclaimer, the term of this patent is extended or adjusted under 35 U.S.C. 154(b) by 234 days.

(21) Appl. No.: 12/891,402

(22) Filed: Sep. 27, 2010

(65) Prior Publication Data

US 2011/0011620 A1    Jan. 20, 2011

Related U.S. Application Data

(63) Continuation of application No. PCT/EP2009/053806, filed on Mar. 31, 2009.

(30) Foreign Application Priority Data

Apr. 3, 2008   (EP) .................................... 08154025

(51) Int. Cl.
    H01R 4/58          (2006.01)
(52) U.S. Cl. ................................................... 174/133 R
(58) Field of Classification Search .............. 174/133 R, 174/94 R; 439/66
    See application file for complete search history.

(56) References Cited

U.S. PATENT DOCUMENTS

| 5,573,435 A | 11/1996 | Grabbe et al. |
| 5,865,641 A | 2/1999 | Swart et al. |
| 6,083,059 A | 7/2000 | Kuan |
| 6,783,405 B1 * | 8/2004 | Yen ............................... 439/824 |
| 6,855,010 B1 | 2/2005 | Yen |
| 7,445,518 B2 | 11/2008 | Schneider Nee Hild et al. |
| 8,157,597 B2 * | 4/2012 | Chang ........................... 439/660 |

| 2007/0040262 A1 | 2/2007 | Huang et al. |
| 2007/0270009 A1 | 11/2007 | Schneider Nee Hild et al. |
| 2008/0153316 A1 | 6/2008 | Rabotti |

FOREIGN PATENT DOCUMENTS

| EP | 1 852 943 A1 | 11/2007 |
| WO | WO 2005/122339 A1 | 12/2005 |
| WO | WO 2006/109163 A1 | 10/2006 |

OTHER PUBLICATIONS

International Search Report (PCT/ISA/210) issued on Aug. 28, 2009, by European Patent Office as the International Searching Authority for International Application No. PCT/EP2009/053806.
Written Opinion (PCT/ISA/237) issued on Aug. 28, 2009, by European Patent Office as the International Searching Authority for International Application No. PCT/EP2009/053806.
Search Report issued on Oct. 6, 2008, by European Patent Office for European Application No. EP 08154025.4.
Notification Concerning Transmittal of International Preliminary Report on Patentability (Forms PCT/IB/326 and PCT/IB/373) and the Written Opinion of the International Searching Authority (Forms PCT/ISA/237) issued in corresponding International Application No. PCT/EP2009/053806 dated Oct. 14, 2010.
Office Action issued on Mar. 30, 2012 in corresponding Chinese Application No. 200980112553.3.

* cited by examiner

*Primary Examiner* — Chau Nguyen
(74) *Attorney, Agent, or Firm* — Buchanan Ingersoll & Rooney PC

(57) ABSTRACT

An electrical conductor includes a primary electrical contact, at least one secondary electrical contact, and a connection element. The connection element electrically connects the first and the at least one secondary electrical contacts, and includes at least one plate-like region. Each plate-like region includes at least one deflection component with at least one first and at least one second pivot, wherein the first and second pivots of each deflection means are arranged such that each secondary electrical contact is movable relative to the primary electrical contact in a deflection direction, without creation of a shear force.

21 Claims, 5 Drawing Sheets

ELECTRICAL CONDUCTOR

RELATED APPLICATION

This application claims priority as a continuation application under 35 U.S.C. §120 to PCT/EP2009/053806, which was filed as an International Application on Mar. 31, 2009 designating the U.S., and which claims priority to European Application 08154025.4 filed in Europe on Apr. 3, 2008. The entire contents of these applications are hereby incorporated by reference in their entireties.

FIELD

The present disclosure relates to the field of power electronics. More particularly, the present disclosure relates to an electrical conductor, to an electrical terminal including such an electrical conductor, and to a semiconductor module including such an electrical conductor or electrical terminal.

BACKGROUND INFORMATION

Electrical terminals for semiconductor power modules as IGBTs (Insulated Bipolar Gate transistors) power modules switch currents up to a few thousand Amperes. The electric connection from the outer contacts of the module to the chips is provided by metal conductors which are referred to as terminals. The terminals have one electrical contact for the outer contact, which is fixed at the housing. FIG. 1 shows a known electrical terminal 10. The electrical terminal 10 includes a primary electrical contact 2, a secondary electrical contact 3, and a connection element 4, which electrically connects the first and secondary electrical contacts 2, 3. The connection element 4 is arranged in a plane and includes a plate-like region 41 with a deflection means 44. The deflection means 44 includes a first section 45, a second section 46 and a third section 47, which is arranged between the first and second sections 45, 46. The first section 45 is separated from the third section 47 by a first cut 451, except for a first joint 454 acting as a first hinge which includes a first pivot 452. The second section 46 is correspondingly separated from the third section 47 by a second cut 461, except for a second joint 464 acting as a second hinge which includes a second pivot 462. The first and second joints 454, 464 have a reduced cross-section as compared to the third section 47 between these joints 454, 464 in order to improve the bending capability of the pivots 452, 462. By this arrangement, a current path 5 (dotted line in FIG. 1) is formed from the primary electrical contact 2 through the first section 45, the first joint 454, the third section 47, the second joint 464, the second section 46, and the secondary electrical contact 3. The top part of the terminal 10 is fixed with the module housing so that the primary electrical contact 2 sticks out of the housing. The secondary electrical contact 3, which is arranged within the semiconductor module, is soldered to a metalized ceramic substrate for electrically contacting a semiconductor chip. In cases of modules with a number of parallel connected IGBTs, such a terminal 10 includes two secondary electrical contacts 3 (a first and second secondary electrical contact 31, 32), which are electrically connected to the primary electrical contact 2 by a common first section 45 and a mirror-inverted arrangement of the first joints 454, the third sections 47, the second joints 464, the second sections 46, and the corresponding first or second secondary electrical contacts 31, 32.

During operation of the power module, the module undergoes temperature changes due to currents, which lead to self-heating of the terminals, especially at high currents or fast current changes, which can occur during switching processes. This leads to a cyclic expansion of the module housing. As a result, the primary electrical contact 2 is displaced with respect to the secondary electrical contact 3, and forces are applied to the terminal 10, which lead to a dilatation or compression of the deflection means 44. To achieve this movement, the terminal bends at the first and second pivots 452, 462, thereby creating normal forces $F_N$ (shown by the arrow in FIG. 1) and shear forces $F_S$ on the secondary electrical contact 3 (31, 32). These shear forces $F_S$ lead to solder deformation at the contact between the secondary electrical contact 3 (31, 32) and the substrate, and finally lead to a module failure.

In order to keep the temperature rise of the terminals 10 low, the electric resistance of the plate-like region 41 has to be low, which can be achieved by plates with a large cross-section. On the other hand, in order not to have high forces occurring in the module when it is expanded by temperature changes, high mechanical flexibility of the terminal is required, which can be achieved by plates with a small width, i.e. a small cross-section.

FIG. 2 shows an electrical terminal 10 with two secondary electrical contacts 31, 32, in each of which shear forces $F_S$ are created. Such a plurality of secondary electrical contacts are used for parallel connecting a plurality of chips.

SUMMARY

An exemplary embodiment provides an electrical conductor, which includes a primary electrical contact, at least one secondary electrical contact, and a connection element. The connection element electrically connects the first electrical contact and the at least one secondary electrical contact, and the connection element includes at least one plate-like region. Each plate-like region includes at least one deflection means having at least one first pivot and at least one second pivot. The first and second pivots of each deflection means are arranged such that each secondary electrical contact is movable relative to the primary electrical contact in a deflection direction without creation of a shear force. At least one current path is formed from the primary electrical contact through the at least one first pivot and the at least one second pivot to the at least one secondary electrical contact. The first and the second pivots of each deflection means are arranged on at least one connecting line, which lies substantially perpendicular to the deflection direction.

BRIEF DESCRIPTION OF DRAWINGS

Additional refinements, advantages and features of the present disclosure are described in more detail below with reference to exemplary embodiments illustrated in the drawings, in which.

The reference symbols used in the drawings and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
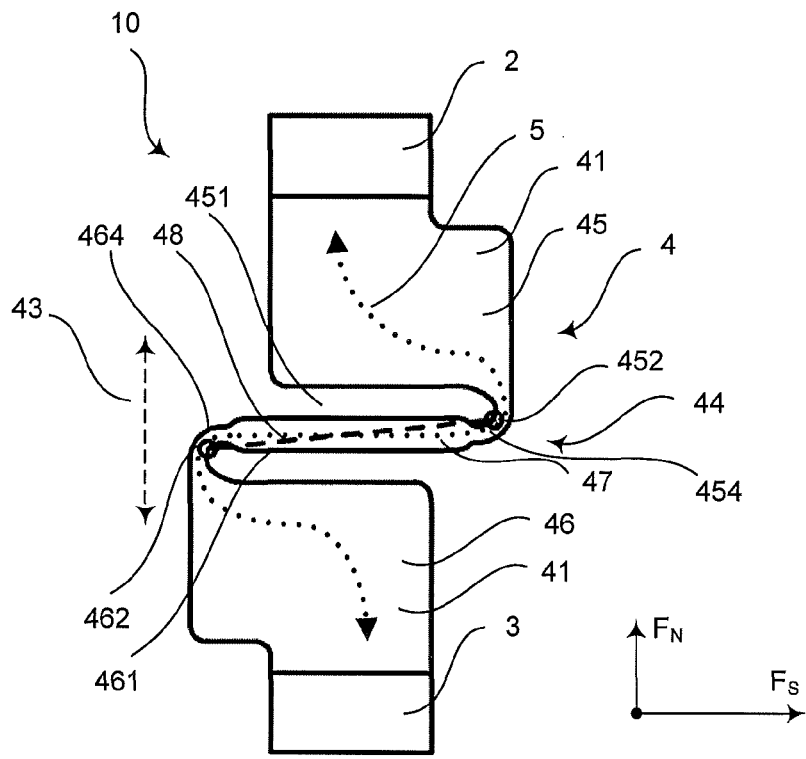
FIG. 1 shows a known electrical conductor with one secondary electrical contact and one deflection means.
Figure 2:
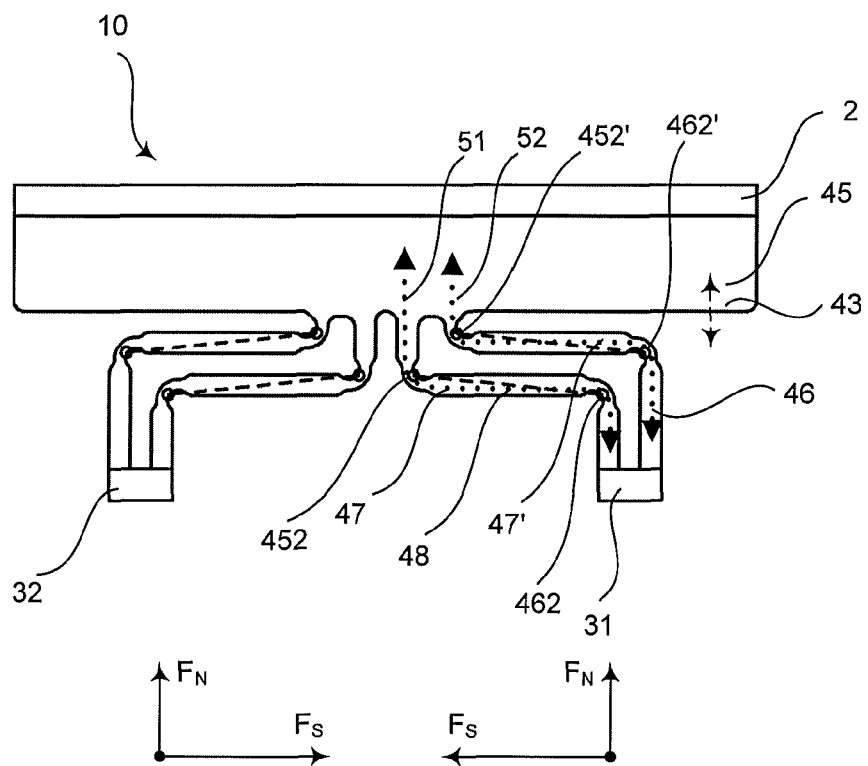
FIG. 2 shows another known electrical conductor with two secondary electrical contacts.

Exemplary embodiments of the present disclosure provide an electrical conductor with improved mechanical flexibility and a low electrical resistance, in which solder deformation in case of temperature changes is reduced or eliminated, and the lifetime of the device is thus increased.

Exemplary embodiments of the present disclosure also provide an electrical terminal having such an electrical conductor, and a semiconductor module with such an electrical conductor or electrical terminal.

According to an exemplary embodiment, the electrical conductor includes a primary electrical contact, at least one secondary electrical contact, and a connection element, which electrically connects the first and the at least one secondary electrical contacts. The connection element includes at least one plate-like region. Each plate-like region includes at least one deflection means (e.g., deflection component) with at least one first pivot and at least one second pivot. The first and second pivots of each deflection means are arranged such that each secondary electrical contact is movable relative to the primary electrical contact in a deflection direction, without creation of a shear force in case of movements in the deflection direction.

In accordance with this exemplary arrangement of pivots in the deflection means, no shear forces are applied to the secondary electrical contacts and to the solder layer on a substrate inside a semiconductor module, which shear forces can lead during operation to cracks in the solder layer or even to a separation of the electrical connection.

Due to the positioning of the pivots in such a way that no shear forces are created, all cross sections, such as the regions at and between the pivots, can be made with a large cross-section, which achieves a lowering of the electrical resistance, without reducing the mechanical flexibility of the electrical conductor.

The electrical conductor can be constructed in such a way that more than one current path is created between the primary and a secondary electrical contact so that the electrical resistance is lowered and less heat is produced in each of the current paths, while the conductor still has good mechanical flexibility. No shear forces are created between the primary electrical contact and any of the secondary contacts, and no shear forces are created in any of these current paths.

In addition, a plurality of secondary electrical contacts can be constructed in one electrical conductor, and these secondary electrical contacts can be arranged in the same direction or in different directions, thereby improving the geometrical possibilities of the arrangement of chips within the housing.

Even in one current path, a plurality of deflection means can be arranged one after the other, so that a serial arrangement is achieved, thereby improving the mechanical flexibility, while still keeping the electrical resistance low.

Furthermore, if a plurality of current paths leads to one or more secondary electrical contacts, it is possible to form the current paths in such a way that the current paths have the same or substantially the same electrical resistance so that the current distribution in the power module is better balanced.

The electrical conductor according to the exemplary embodiments of the present disclosure can be used for creating an electrical connection between two electrical elements within a semiconductor module or for creating an external electrical contact, for example.

Figure 3:
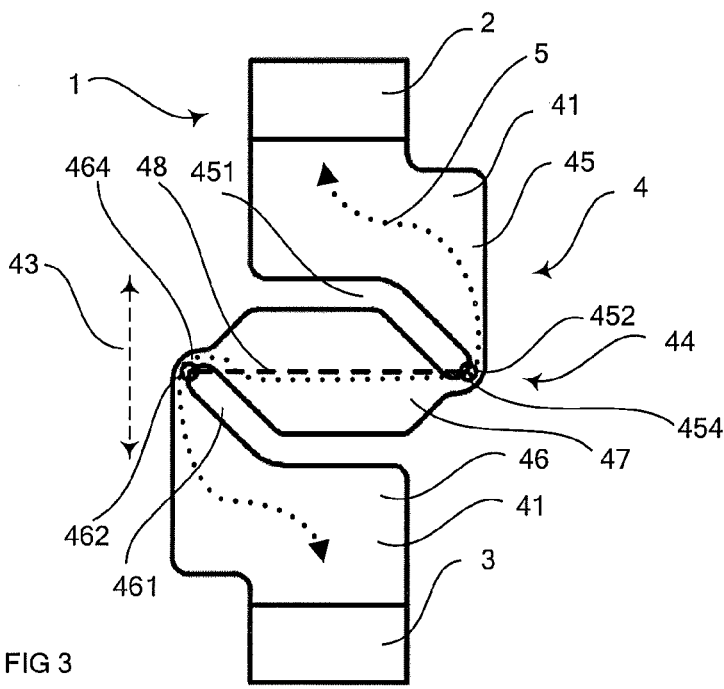
FIG. 3 shows an exemplary embodiment of an electrical conductor with one secondary electrical contact, according to the present disclosure.

FIG. 3 shows an exemplary embodiment of an electrical conductor 1 according to the present disclosure. The electrical conductor 1 includes a primary electrical contact 2, a secondary electrical contact 3, and a connection element 4, which electrically connects the first and the secondary electrical contacts 2, 3 and which includes at least one plate-like region 41. The plate-like region 41 includes a deflection means 44 (e.g., a deflection component) with a first and a second pivot 452, 462 (emphasized in FIG. 3 by a circle around the pivots), which are arranged such that the secondary electrical contact 3 is movable relative to the primary electrical contact 2 in a deflection direction 43, without creation of a shear force. Shear forces are forces substantially perpendicular to the deflection direction. The electrical conductor 1 can be compressed or lengthened in that the conductor 1 is bended at the first and second pivot 452, 462. In the exemplary embodiment illustrated in FIG. 3, the conductor 1 includes the plate-like region 41, which is arranged in a plane. The first and second pivots 452, 462 of the deflection means 44 are arranged such that the secondary electrical contact 3 is movable relative to the primary electrical contact 2 in the deflection direction 43, which lies within the plane. The first and second pivots 452, 462 of the deflection means 44 are arranged on a virtual connecting line 48 (shown in FIG. 3 by a dashed line), which lies perpendicular to the deflection direction 43.

Alternatively to the plate-like region 41 being arranged in a plane, the plate-like region 41 can have one or more bended portions, which can lie within the deflection means 44, so that the first, second and/or third sections 45, 46, 47 are bended or it can be arranged in any other part of the plate-like region 41.

According to an exemplary embodiment, the electrical contacts 2, 3 of the electrical conductor 1 are bended into a direction substantially perpendicular to the plate-like region 41 so that the electrical contacts 2, 3 lie substantially perpendicular to the deflection direction 43 and to the plane, in which the plate-like region 41 is arranged. Further, the electrical contacts 2, 3 are prepared to make electrical contact to conductors, which are arranged in two planes, which are parallel to each other.

According to an exemplary embodiment, the deflection means 44 includes a first section 45, a second section 46, and a third section 47, which is arranged between the first and second sections 45, 46.

The first section 45 is separated from the third section 47 by a first cut 451 except for a first joint 454 acting as a first hinge between the first section 45 and the third section 47. The first hinge can be moved around the first pivot 452 (emphasized in FIG. 3 by a circle). The second section 46 is separated from the third section 47 by a corresponding second cut 461 except for a second joint 464 acting as a second hinge that includes the second pivot 462. A current path 5 is formed from the primary electrical contact 2 through the first section 45, the first joint 454, the third section 47, the second joint 462 and the second section 46 to the secondary electrical contact 3. The cuts can be made by any appropriate method such as stamping, jet cutting, etching, eroding or milling, for example.

The first section 45, the second section 46 and the third section 47 are stiff. For example, the first, second and third sections 45, 46, 47 are stiff as compared to the first joint 454 and the second joint 464. Thus, the flexibility of the deflection means 44 is achieved by the joints 454, 464.

In accordance with an exemplary embodiment, the maximum cross section of the third section 47 of the a current path 5 is at least two times, e.g., three times, larger than the cross section of the first and/or second joint 452, 454, 462, 464 of the current path 5. By such a geometrical design, the electrical resistance can be made low without loosing flexibility.

The width of the first and/or second cuts 451, 461 can correspond, for example, at most 1.5 times of the thickness of the plate-like region 41, not more than the thickness of the plate-like region 41. By such a width, the deflection means 44 has a high flexibility for adjustment of temperature expansions. The length of a first and/or second cut 451, 461 can be, in accordance with another exemplary embodiment, at least two times, e.g., three times longer, than the width of the cut.

In accordance with an exemplary embodiment, the deflection means 44 can be formed in one piece. Thus, the first section 45, the first joint, the third section 47, the second joint 464 and the second section 46 are can be integrally formed with each other.

Additional exemplary embodiments of the present disclosure are shown in FIGS. 4-10. The above mentioned features regarding stiffness, flexibility and dimensions of the deflection means 44 and its subparts such as the first section, the second section, the third section, the first joint and the second joint can also be applied to the additional exemplary embodiments described below.

Figure 4:
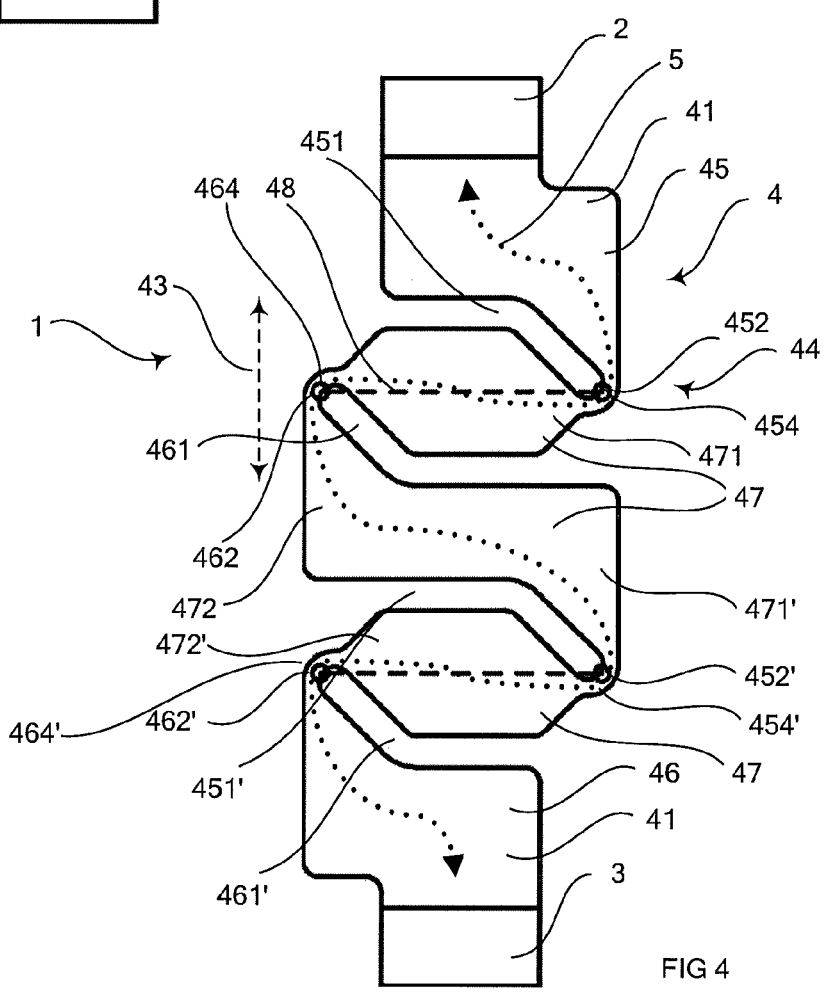
FIG. 4 shows another exemplary embodiment of an electrical conductor with one secondary electrical contact and subsections, according to the present disclosure.

FIG. 4 shows another exemplary embodiment of the electrical conductor 1 with two sets of pivots, which are arranged serially, where each set of two pivots 452, 462, 452', 462' is arranged on a virtual connecting line 48, 48', which are arranged parallel to each other. In this exemplary embodiment, the third section 47 includes first subsections 471, 471' and second subsections 472, 472'. The electrical conductor 1 as shown in FIG. 4 includes a first section 45, which is separated from the first subsection 471 of the third section 47 by a first cut 451 except for a first joint 454. This first subsection 471 is separated from a second subsection 472 by a second cut 461 except for a second joint 464 acting as a second hinge that includes a second pivot 462. This second subsection 472 is formed in one piece with another first subsection 471', which is again separated from another second subsection 472' by a first cut 451' except for a first joint 454' acting as a first hinge that includes a first pivot 452'. This other second subsection 472' is separated from the second section 46 by another second cut 461' except for another second joint 464' acting as another second hinge that includes another second pivot 462'. The first and second pivots 452, 462 are arranged on a virtual connecting line 48 and the other first and second pivots 452', 462' are arranged on another connecting line 48', where the connecting lines 48, 48' are arranged parallel to each other. In accordance with another exemplary embodiment, there is an angle between the two connecting lines 48, 48', whereas the angle can be any appropriate angle. For example, the angles between the connecting lines 48, 48' can be small and be about 90° to the deflection direction 43.

Figure 5:
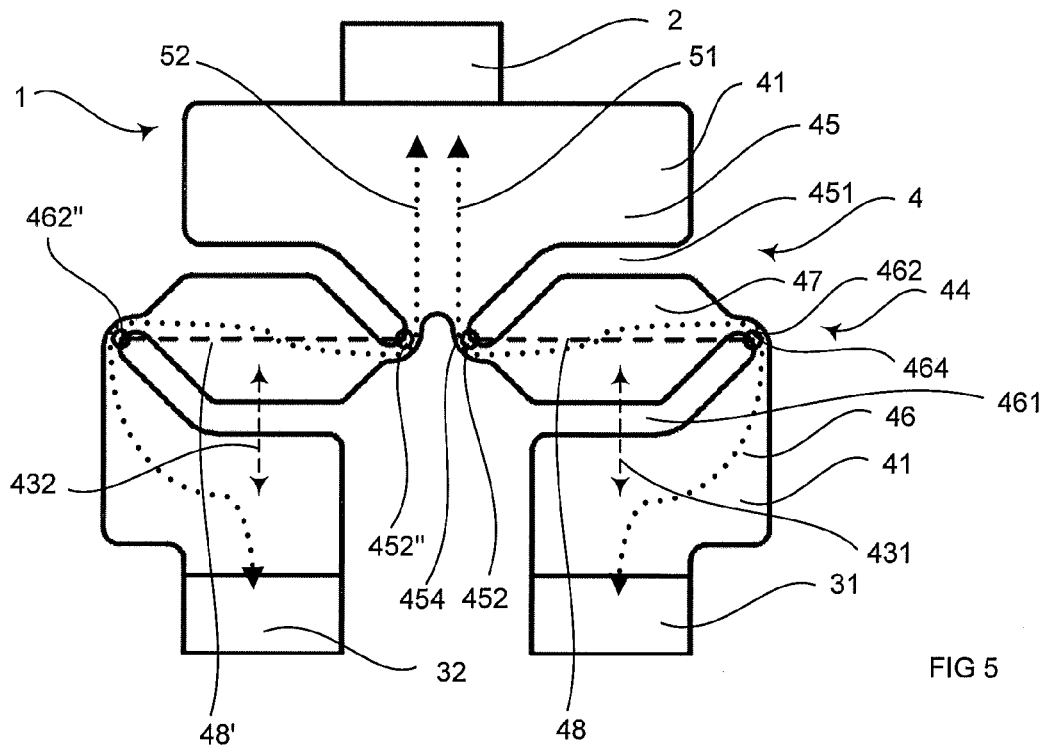
FIG. 5 shows another exemplary embodiment of an electrical conductor with two secondary electrical contacts moveable relative to the primary electrical contact in the same direction, according to the present disclosure.

FIG. 5 shows another exemplary embodiment of the electrical conductor 1 with two secondary electrical contacts. As illustrated in FIG. 5, first and second secondary electrical contacts 31, 32 are provided. The first secondary electrical contact 31 is movable relative to the primary electrical contact 2 in a first deflection direction 431 within a first plane by first and second pivots 452, 462 without creation of a shear force. Additionally, the second secondary electrical contact 32 is movable relative to the primary electrical contact 2 in a second deflection direction 432 within a second plane without creation of a shear force by another first and second pivots 452'', 462''. In the conductor 1 as shown in FIG. 5, the first deflection direction 431 is the same as the second deflection direction 432. For example, the first and second planes can be the same, but there could alternatively also be an angle between the first and second plane.

Figure 6:
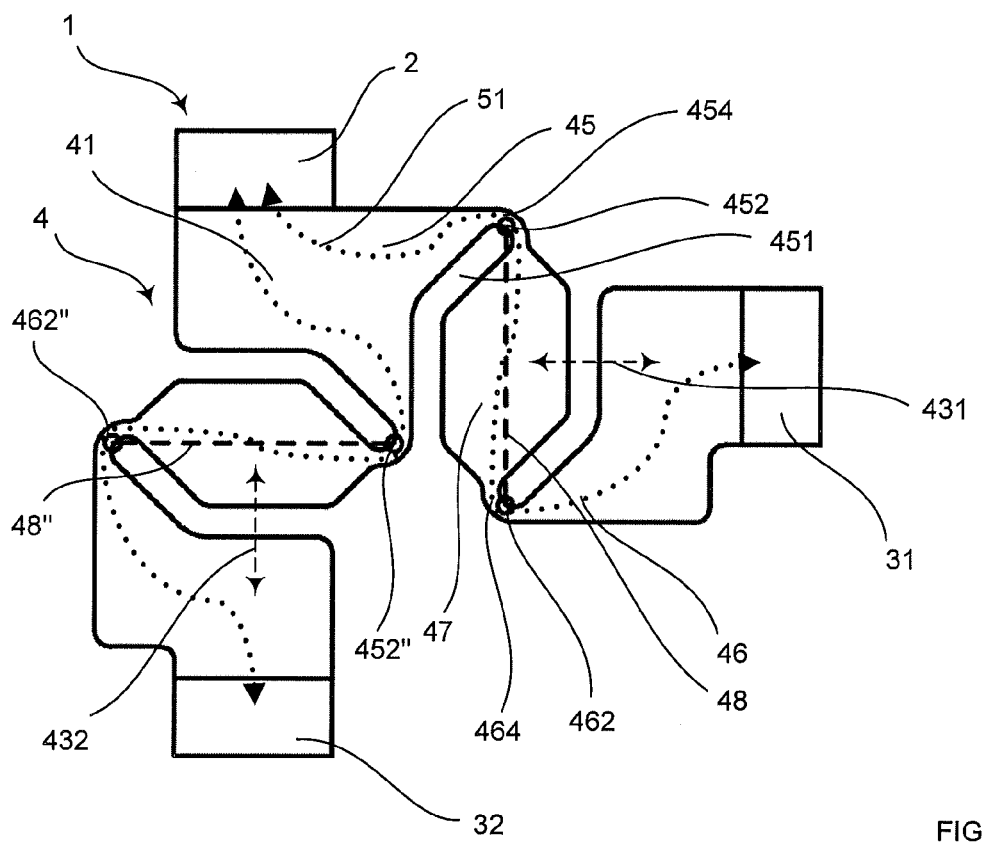
FIG. 6 shows another exemplary embodiment of an electrical conductor with two secondary electrical contacts moveable relative to the primary electrical contact in different directions, according to the present disclosure.

FIG. 6 shows another exemplary embodiment in which the electrical conductor 1 includes, as described for FIG. 5, a first and a second secondary electrical contact 31, 32, which each include a first and second joint 452, 462 and 452'', 462'', respectively. Each pair of joints is arranged on a connecting line 48, 48'', whereas the connecting lines 48, 48'' lie substantially perpendicular to each other. A 90° angle is shown as an example of a possible angle, but the connecting lines 48, 48'' may also be arranged in any other angle to each other.

Figure 7:
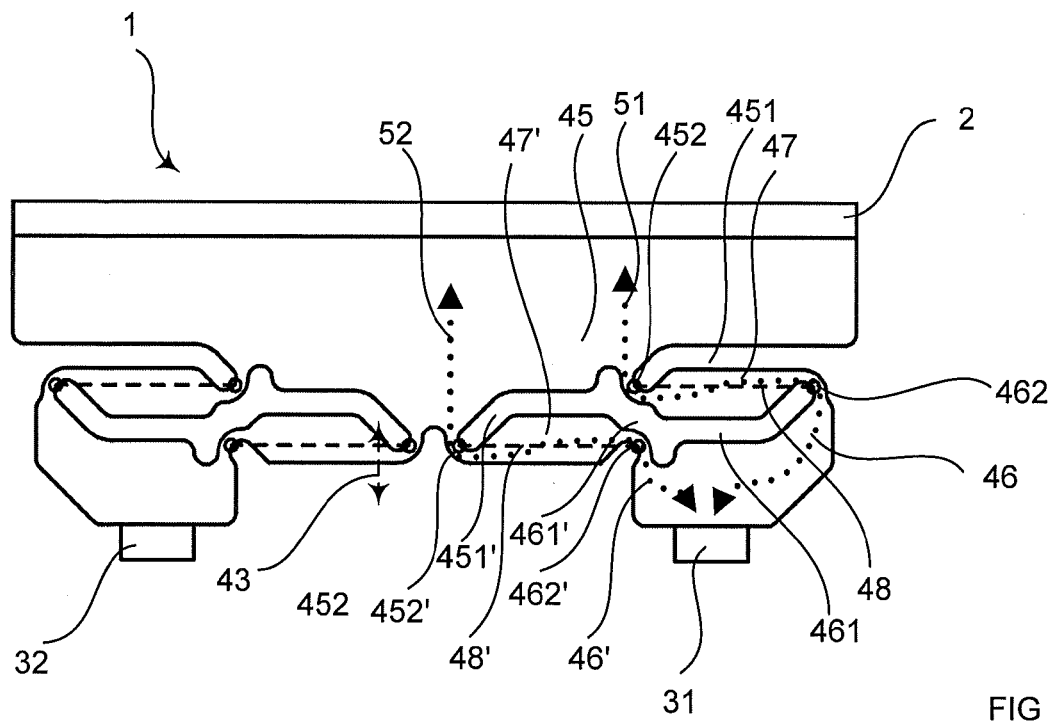
FIG. 7 shows another exemplary embodiment of an electrical conductor with two secondary electrical contacts, which each have two current paths, according to the present disclosure.

FIG. 7 shows another exemplary embodiment of an electrical conductor 1 with two secondary electrical contacts 31, 32. The two secondary electrical contacts 31, 32 each include a first and a second current path 51, 52, which are formed to the first and second secondary electrical contact 31, 32. A first cut 451' of the second current path 52 to form the first secondary electrical contact 31 forms at least partially the second cut 461 of the first current path 51 to the same (first) secondary electrical contact 31. Though FIG. 7 shows two secondary electrical contacts 31, 32, the electrical conductor 1 could also include only one secondary electrical contact 3, with two current paths 51, 52 leading to the one secondary electrical contact 3 with a first cut 451' of the second current path 52 forming at least partially the second cut 461 of the first current path 51 (e.g. right part of FIG. 7).

Figure 8:
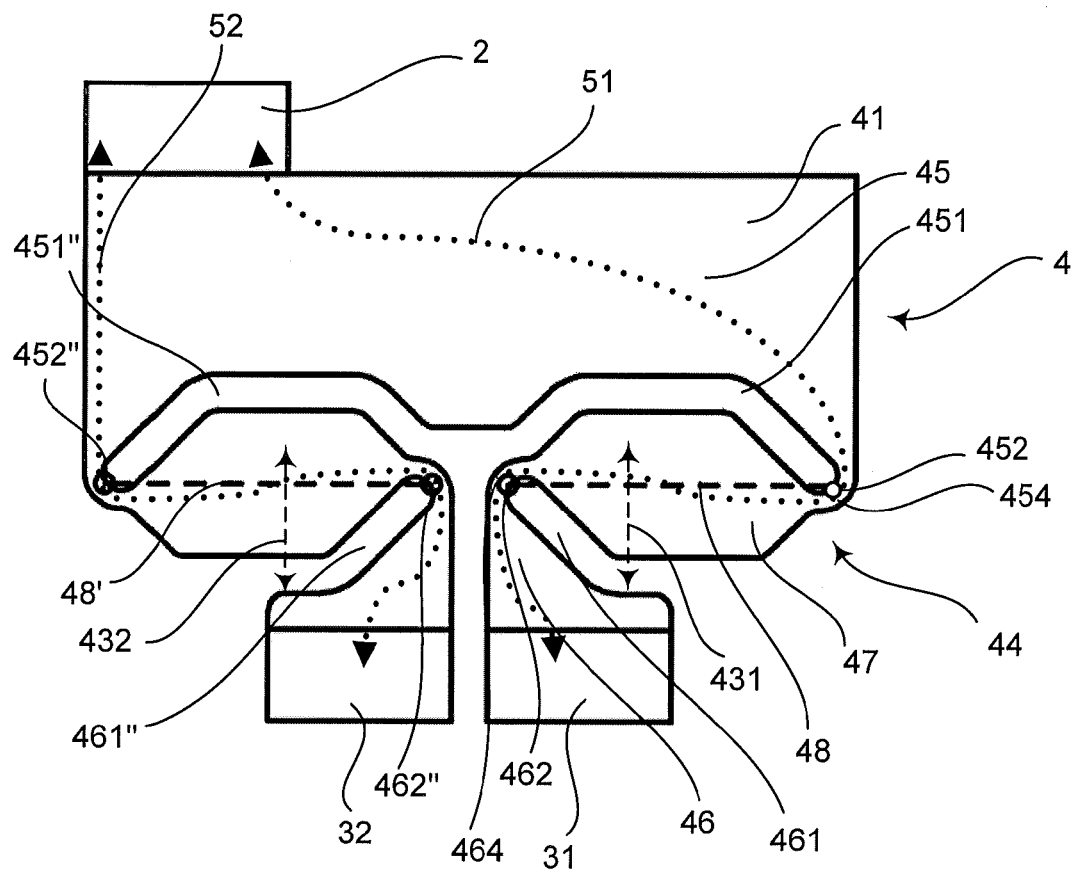
FIG. 8 shows another exemplary embodiment of an electrical conductor with two secondary electrical contacts and an asymmetrically arranged first electrical contact, according to the present disclosure.

FIG. 8 shows another exemplary embodiment of an electrical conductor 1 with two secondary electrical contacts 31, 32 and a mirror-inverted arrangement of the first and second current paths 51, 52, the first and second cuts 451, 451'', 461, 461'' and the pivots 452, 452'', 462, 462''. In this exemplary embodiment, the first electrical contact 2 is arranged asymmetrically at one side of the connection element 4. Such an arrangement can be advantageous for geometrical reasons, e.g. if a plurality of electrical conductors has to be arranged in one semiconductor module for contacting a plurality of semiconductor chips and for insulation reasons between terminals in a module. The first cuts 451, 451'' of the two current paths 51, 52 are one continuous cut, though of course it would also be possible to have separate cuts. The mirror-inverted, thus symmetrical design of the cuts as shown in FIG. 8 is the easiest geometrical arrangement of cuts. It is also possible that the second sections 46, 46' are one common, continuous section, but leading to two secondary electrical contacts 31, 32.

If, however, the first electrical contact 2 is arranged on one side of the connection element 4, the first and second current paths 51, 52 have different length and different electrical resistances. For applications, in which high currents occur, it is possible to have several current paths to one or to more secondary electrical contacts 31, 32, all of which have the same or at least a similar electrical resistance so that the current distribution is balanced between the parts in the power module.

Figure 9:
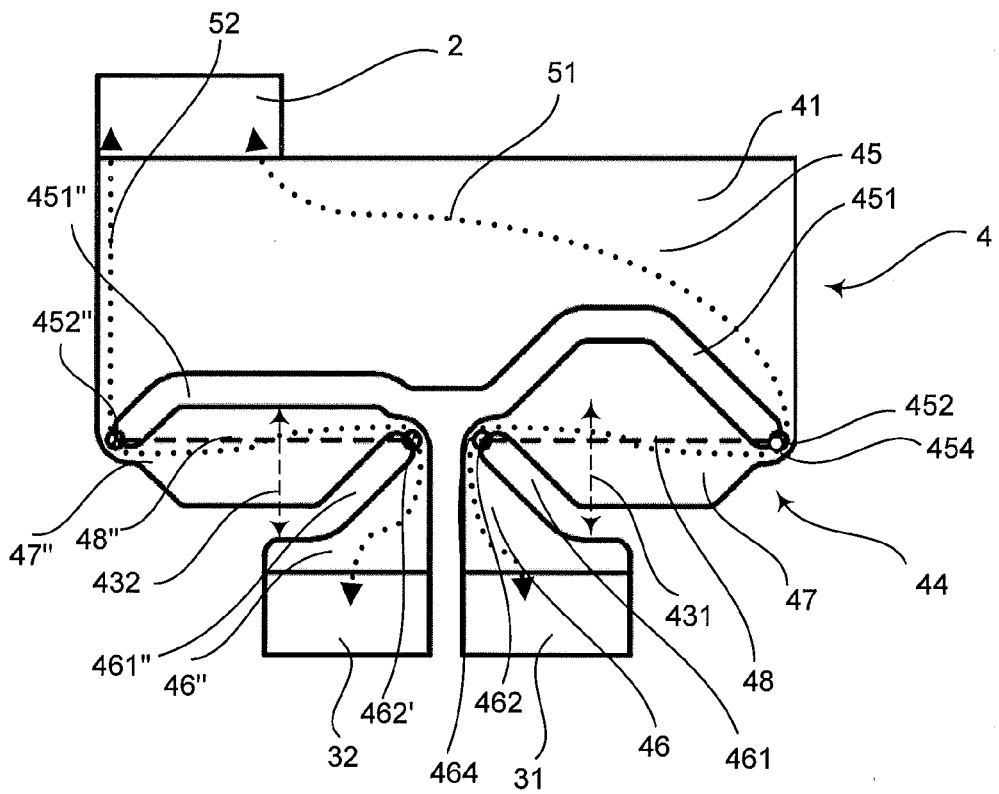
FIG. 9 shows another exemplary embodiment of an electrical conductor with an asymmetrically arranged first electrical contact, two secondary electrical contacts, and current paths of adapted electrical resistance, according to the present disclosure.

In FIG. 9, an exemplary embodiment of an electrical conductor 1 with two secondary electrical contacts 31, 32 is shown. The first current path 51 is longer than the second current path 52, because of the asymmetrical arrangement of the first electrical contact 2 on the left side of the connection element 4. In order to make the electrical resistances of the current paths 51, 52 equal or at least to adapt them to each other, the first current path 51 has a greater cross-section in its third section 47 than the cross-section in its third section 47" of the shorter second current path 52.

Figure 10:
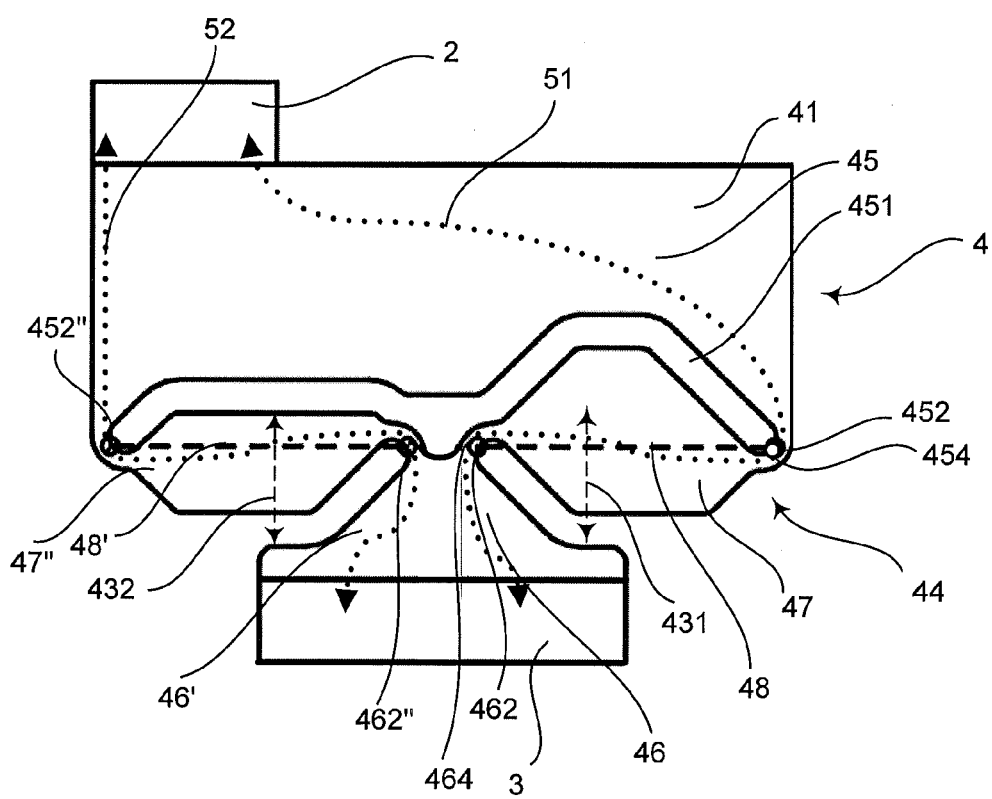
FIG. 10 shows another exemplary embodiment of an electrical conductor with an asymmetrically arranged first electrical contact, one secondary electrical contact and two current paths of adapted electrical resistance, according to the present disclosure.

In FIG. 10, another exemplary embodiment is shown with an electrical conductor 1 including one secondary electrical contact 3, to which a first and a second current paths 51, 52 lead. In this exemplary embodiment, the first current path 51 is longer than the second one 52, and the third section 47 of the first current path 51 has a greater cross section than the third section 47" of the second current path 52 as already discussed for the conductor according to FIG. 9. Both current paths 51, 52 have one common, continuous second section 46, 46', which leads to the secondary electrical contact 3.

The electrical conductor 1 according to any one of the above-described exemplary embodiments can be used as an electrical terminal in a semiconductor power module for providing an external electrical contact, i.e. an electrical connection between the chips in the module to an external electrical contact. In an alternative embodiment, such an electrical conductor can be used for internal electrical connections within a semiconductor module. If a semiconductor module comprises a plurality of semiconductor chips, it can comprise one or more such inventive electrical terminals and/or internal electrical conductors.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

Electrical element 1
Electrical terminal 10
primary electrical contact 2
at least one secondary electrical contact 3
first secondary electrical contact 31
second secondary electrical contact 32
connection element 4
at least one plate-like region 41
deflection direction 43
first deflection direction 431
Second deflection direction 432
deflection means 44
at least one first section 45
first cut 451, 451', 451"
first pivot 452, 452', 452"
first joint 454, 454', 454"
at least one second section 46
Second cut 461, 461', 461"
Second pivot 462, 462', 462"
Second joint 464, 464', 464"
at least one third section 47, 47'
first subsection 471, 471'
Second subsection 472, 472'
connecting line 48, 48', 48"
at least one current path 5
first current path 51
Second current path 52

What is claimed is:

1. An electrical conductor comprising:
a primary electrical contact;
at least one secondary electrical contact; and
a connection element, which electrically connects the first electrical contact and the at least one secondary electrical contact, the connection element comprising at least one plate-like region, wherein:
each plate-like region comprises at least one deflection means having at least one first pivot and at least one second pivot;
the first and second pivots of each deflection means are arranged such that each secondary electrical contact is movable relative to the primary electrical contact in a deflection direction without creation of a shear force;
at least one current path is formed from the primary electrical contact through the at least one first pivot and the at least one second pivot to the at least one secondary electrical contact; and
the first and the second pivots of each deflection means are arranged on at least one connecting line, which lies substantially perpendicular to the deflection direction;
wherein each deflection means respectively comprises:
at least one first section,
at least one second section, and
at least one third section, which is arranged between the first section and the at least one second section, and wherein:
the first section is separated from the third section except for a first joint acting as a first hinge that includes the first pivot;
the at least one second section is separated from the third section except for a second joint acting as a second hinge that includes the second pivot; and
at least one first current path is formed from the primary electrical contact through the first section, the first joint, the third section, the second joint, and the at least one second section to the secondary electrical contact.

2. The electrical conductor according to claim 1, wherein at least one plate-like region comprises at least one bended portion.

3. The electrical conductor according to claim 1, wherein at least one of (i) the first section is separated from the third section by at least one first cut, and (ii) the second section is separated from the third section by at least one second cut.

4. The electrical conductor according to claim 3, wherein at least one of the first and second cuts has a width that corresponds at most 1.5 times the thickness of the plate-like region.

5. The electrical conductor according to claim 3, wherein:
the electrical conductor comprises the at least one first current path and at least one other current path to at least one secondary electrical contact;

the at least one first and second cuts and the at least one first and second joints are formed in such a way that the at least two current paths have the same electrical resistance.

6. The electrical conductor according to claim 3, wherein:
the at least one third section comprises at least two first and second subsections,
the first section is separated from the first subsection of the at least one third section except for the first joint;
the first subsection is separated from the second subsection by at least one second cut except for the second joint acting as the second hinge comprising the second pivot, the second subsection being formed in one piece with another first subsection, which is separated from another second subsection by at least one first cut except for the first joint acting as the first hinge comprising the first pivot; and
the other second subsection is separated from the second section by the second cut except for the second joint.

7. The electrical conductor according to claim 3, wherein at least one of the first and second cuts has a width that corresponds at most to the thickness of the plate-like region.

8. The electrical conductor according to claim 1, wherein:
the at least one third section comprises at least two first and second subsections;
the first section is separated from the first subsection of the at least one third section except for the first joint;
the first subsection is separated from the second subsection by at least one second cut except for the second joint acting as the second hinge comprising the second pivot, the second subsection being formed in one piece with another first subsection, which is separated from another second subsection by at least one first cut except for the first joint acting as the first hinge comprising a first pivot; and
the other second subsection is separated from the second section by the second cut except for the second joint.

9. The electrical conductor according to claim 8, wherein:
the at least one secondary electrical contact comprises a first secondary electrical contact and a second secondary electrical contact;
the first secondary electrical contact is movable relative to the primary electrical contact in a first deflection direction within a plane without creation of a shear force;
the second secondary electrical contact is movable relative to the primary electrical contact in a second deflection direction within a plane without creation of a shear force; and
the first deflection direction is one of (i) the same as the second deflection direction, and (ii) different from the second deflection direction.

10. The electrical conductor according to claim 1, wherein:
the at least one secondary electrical contact comprises a first secondary electrical contact and a second secondary electrical contact;
the first secondary electrical contact is movable relative to the primary electrical contact in a first deflection direction within a plane without creation of a shear force;
the second secondary electrical contact is movable relative to the primary electrical contact in a second deflection direction within a plane without creation of a shear force; and
the first deflection direction is one of (i) the same as the second deflection direction, and (ii) different from the second deflection direction.

11. The electrical conductor according to claim 10, wherein:
at least two current paths, comprising the at least one first current path and a second current path, are formed to the at least one secondary contact; and
a first cut of the first current path at least partially forms a second cut of the second current path.

12. The electrical conductor according to claim 1, wherein:
at least two current paths, comprising the first current path and a second current path, are formed to the at least one secondary contact; and
a first cut of the first current path at least partially forms a second cut of the second current path.

13. The electrical conductor according to claim 1, wherein:
the at least one secondary electrical contact comprises a first secondary electrical contact and a second secondary electrical contact; and
a first cut of a current path to the first secondary electrical contact forms a continuous cut with a first cut of a current path to the second secondary electrical contact.

14. The electrical conductor according to claim 13, wherein the second sections of the current paths to the first and second secondary electrical contacts form a continuous section.

15. The electrical conductor according to claim 1, wherein the electrical conductor comprises the at least one first current path and at least one another current path to at least one secondary electrical contact;
at least one of the first and other current paths is longer than the other current path and the longer current path has a greater cross-section in its third section than the cross-section in its third section of at least one of the shorter current paths.

16. The electrical conductor according to claim 1, wherein the maximum cross section of the third section of the at least one current path is at least three times larger than the cross section of at least one of the first and second joint of the first current path.

17. The electrical conductor according to claim 1, wherein the length of at least one of the first and second cuts is at least three times longer than the width of the corresponding cut.

18. An electrical terminal for providing an external electrical contact of a semiconductor module, the electrical terminal comprising an electrical conductor according to claim 1.

19. A semiconductor module with an electrical terminal according to claim 18.

20. An electrical conductor comprising:
a primary electrical contact;
at least one secondary electrical contact; and
a connection element, which electrically connects the first electrical contact and the at least one secondary electrical contact, the connection element comprising at least one plate-like region, wherein:
each plate-like region comprises at least one deflection means having at least one first pivot and at least one second pivot;
the first and second pivots of each deflection means are arranged such that each secondary electrical contact is movable relative to the primary electrical contact in a deflection direction without creation of a shear force;
at least one current path is formed from the primary electrical contact through the at least one first pivot and the at least one second pivot to the at least one secondary electrical contact;
the first and the second pivots of each deflection means are arranged on at least one connecting line, which lies substantially perpendicular to the deflection direction;

each of the at least one plate-like region is arranged in a plane;

the first and second pivots of each deflection means are arranged such that the primary electrical contact is movable relative to each secondary electrical contact in the deflection direction, which lies within the plane;

each deflection means respectively comprises:

at least one first section, at least one second section, and at least one third section, which is arranged between the first section and the at least one second section, and wherein:

the first section is separated from the third section except for a first joint acting as a first hinge that includes the first pivot;

the at least one second section is separated from the third section except for a second joint acting as a second hinge that includes the second pivot; and at least one current path is formed from the primary electrical contact through the first section, the first joint, the third section, the second joint, and the at least one second section to the secondary electrical contact.

21. The electrical conductor according to claim 20, wherein at least one of (i) the first section is separated from the third section by at least one first cut, and (ii) the second section is separated from the third section by at least one second cut.

* * * * *